United States Patent [19]

Hayashi et al.

[11] Patent Number: 4,567,061

[45] Date of Patent: Jan. 28, 1986

[54] METHOD FOR MANUFACTURE OF INSULATING FILM AND INTERFACE BETWEEN INSULATION FILM AND SEMICONDUCTOR

[75] Inventors: Yutaka Hayashi, Tanashi; Iwao Hamaguchi, Yokohama; Kiyohiko Kobayashi, Yamato, all of Japan

[73] Assignees: Agency of Industrial Science & Technology; Ministry of International Trade & Industry, both of Tokyo, Japan

[21] Appl. No.: 635,477

[22] Filed: Jul. 30, 1984

Related U.S. Application Data

[63] Continuation of Ser. No. 190,971, Sep. 26, 1980, abandoned.

[30] Foreign Application Priority Data

Oct. 26, 1979 [JP] Japan .................................. 54-138923

[51] Int. Cl.⁴ .......................................... H01C 21/316
[52] U.S. Cl. .......................................... 427/93; 427/82
[58] Field of Search .................................... 427/93, 82

[56] References Cited

U.S. PATENT DOCUMENTS

| | | | |
|---|---|---|---|
| 3,692,571 | 9/1972 | Colton et al. | 427/93 |
| 3,698,948 | 10/1972 | Barone et al. | 427/95 |
| 4,007,294 | 2/1977 | Woods et al. | 427/93 |
| 4,223,048 | 9/1980 | Engle | 427/95 |
| 4,232,057 | 11/1980 | Ray | 427/39 |
| 4,246,296 | 1/1981 | Chang | 427/93 |

FOREIGN PATENT DOCUMENTS 55-22862  2/1980  Japan ..................................... 427/95

*Primary Examiner*—John D. Smith
*Attorney, Agent, or Firm*—Oblon, Fisher, Spivak, McClelland & Maier

[57] ABSTRACT

An insulation film of improved properties and an interface of similarly improved properties between the insulation film and a semiconductor are produced by heating silicon, a silicon compound or a silicon dioxide film in an atmosphere formed by incorporating a carbon fluorine gas into an oxidative gas.

3 Claims, 4 Drawing Figures

METHOD FOR MANUFACTURE OF INSULATING FILM AND INTERFACE BETWEEN INSULATION FILM AND SEMICONDUCTOR

This invention is a continuation of application Ser. No. 190,971 filed Sept. 26, 1980 now abandoned.

BACKGROUND OF THE INVENTION

This invention relates to a method for the manufacture of a silicon oxide-based insulation film and an interface possessing stable electric properties between the insulation film and a semiconductor.

Heretofore, for the purpose of immobilizing the movable ions in the silicon dioxide ($SiO_2$) constituting the insulation film and consequently stabilizing the electric properties of the insulation film, there has been generally adopted a method which involves subjecting the $SiO_2$ film to a thermal treatment in an atmosphere containing phosphoric oxide at an elevated temperature thereby forming a phosphorus glass layer on the surface thereof and gettering the movable ions or subjecting the $SiO_2$ film to thermal oxidation in an atmosphere containing chlorine or hydrogen chloride thereby introducing into the $SiO_2$ film chlorine atoms as a barrier to the movable ions. It has been further known that this oxidation in the atmosphere containing chlorine is effective in lowering the value of the interface state density between $SiO_2$ and $Si$, decreasing the dispersion of the dielectric strength of the $SiO_2$ film (although, the decrease cannot necessarily be expected to bring about an increase in the value of dielectric strength) and reducing the crystalline defects in the $Si$ surface. Since the radius of the atom of chlorine is larger than that of the atom of $Si$, however, it is difficult for the oxidation to fill completely the defects within the $SiO_2$ film or those in the $Si$ surface. In contrast, hydrogen possesses a smaller atomic radius and, therefore, proves advantageous for the purpose of filling such defects and, actually, is effective in this respect. It nevertheless has a disadvantage that it effuses when $SiO_2$—$Si$ system is heated to temperatures of 300° to 400° C. and it readily yields to electronic state change under the influence of a high-energy carrier, an electron beam or an ultraviolet ray which is transferred to the $SiO_2$ film and the $Si$-$O_2$—$Si$ interface. The inventors' attention was attracted by the fact that fluorine, which is a monovalent element having a smaller atomic radius than $Si$, is effective in enhancing the stability and quality of the $SiO_2$ film and the interface between $SiO_2$ and $Si$. It has been known, on the other hand, that the fluorine ion dissolves $SiO_2$ and, worse still, corrodes quartz reaction tubes generally adopted for thermal oxidation and other similar reactions.

SUMMARY OF THE INVENTION

An object of the present invention is to improve the electric properties of the $Si$ semiconductor and the interface between the $SiO_2$ insulation and the semiconductor by introducing fluorine atoms into the $SiO_2$ insulation film without entailing any adverse effect upon the film, the reaction tube, or the like.

To accomplish the object described above according to this invention, there is provided a method which comprises heating a silicon compound or $Si$ or an $SiO_2$ film in the atmosphere of an oxidizing gas incorporating therein carbon fluoride either alone or in conjunction with chlorine.

DETAILED DESCRIPTION OF THE INVENTION $CF_4$ is a typical example of carbon fluoride gases which are usable in the method of this invention. Further, the derivatives of $CF_4$, i.e. the gaseous compounds of the general formula, $CH_xF_yCl_z$ (wherein, x, y and z are integers of values such that the sum $x+y+z$ is 4, x is from 0 to 3, y is from 1 to 4 and z is from 0 to 3) are also usable for the purpose. Specifically, these derivatives include $CHF_2Cl$, $CF_2Cl_2$ and $CF_3Cl$. Whenever the expression "carbon fluoride gas" is used hereinafter, it shall be understood to embrace the gases represented by the general formula, $CH_xF_yCl_z$.

For the practical purpose, the oxidative gas which constitutes the principal component of the atmosphere for the thermal oxidation treatment is desired to be $O_2$, $CO_2$, $NO_x$ or $H_2O$. Further as the carrier gas, there may be used $N_2$, Ar or He. The expression "silicon dioxide-based" as used herein is meant to embrace pure silicon dioxide and mixtures of silicon dioxide with N, Cl, P and other similar impurities.

Now, the composition of the gases making up the atmosphere for the thermal oxidation treatment will be described.

In this atmosphere, the carbon fluoride gas is desired to be contained in an amount up to about 6% by volume based on the combined volume of the oxidizing gas and the carbon fluoride gas. When the carbon fluoride gas content falls outside this range, the effect of the incorporation of this particular gas falls short of reaching the expected level and meeting the object of this invention.

Only when the atmosphere contains the carbon fluoride gas in the range defined above in addition to the oxidizing gas, can the $SiO_2$ film treated therein be improved in its dielectric strength and other properties without entailing the possibility of the fluorine atom corroding the quartz reaction tube and the $SiO_2$ film. By performing the same treatment on $Si$ or $Si$ compound such as $SiH_4$ or $SiCl_4$, there can be produced an $Si$-$O_2$—$Si$ semiconductor having a lowered interface state density with high electric stability. A conductive electrode-$SiO_2$ insulation film-$Si$ semiconductor (COS) construction made from this $SiO_2$—$Si$ semiconductor enjoys an advantage that the density of surface excess electrons, $N_{FB}$, is small and variation of $N_{FB}$ under the bias voltage-temperature-stress, $\Delta N_{FB}$, is low.

Now, the present invention will be specifically described below with reference to working examples.

Figure 1:
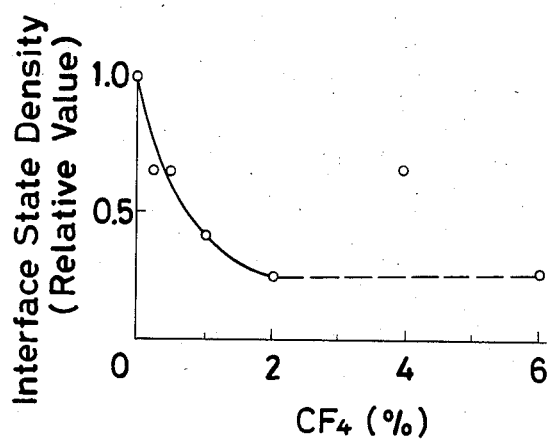
FIG. 1 is a graph showing a typical effect of the incorporation of $CF_4$ gas in the atmosphere for the thermal oxidation treatment upon the decrease of the interface state density.
Figure 2:
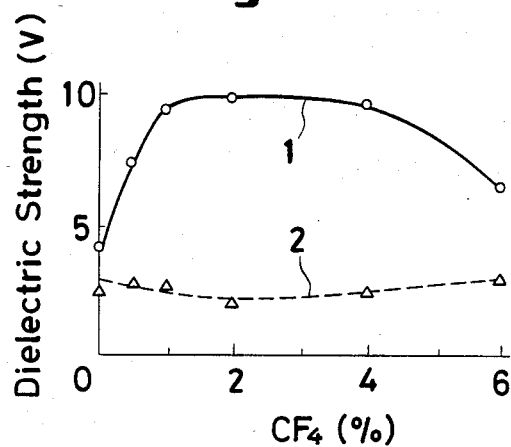
FIG. 2 is a graph showing a typical effect of the incorporation of $CF_4$ gas in the atmosphere for the thermal oxidation treatment upon the increase of the dielectric strength.
Figure 3:
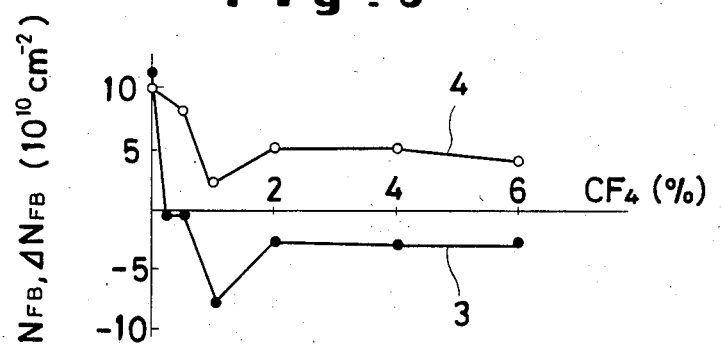
FIG. 3 is a graph showing a typical effect of the incorporation of $CF_4$ gas in the atmosphere for the thermal oxidation treatment upon the decrease of $N_{FB}$ and $\Delta N_{FB}$ (increase of stability).

When silicon substrates were thermally oxidized at temperatures within the range of from 800° to 1200° C.

in varying oxidizing atmospheres incorporating $CF_4$ as the carbon fluoride gas, the interface state density in the interface between $SiO_2$ and Si was observed invariably to decline. FIG. 1 shows the results of one typical thermal oxidation, in which the insulation film had a thickness, $t_{ox}$, of 250 Å, the oxidizing gas was oxygen (0.75 l/min-2 l/min) and the carrier gas was nitrogen (0.75 l/min-2 l/min). In the graph, the vertical axis is graduated for the interface state density (relative value) and the horizontal axis for volume ratio (%) of $CF_4$ to the oxidizing gas. In the present case, the interface state density decreased to $\frac{1}{4}$. When two $SiO_2$ films were grown under the same conditions except that $CF_4$ gas was present in one test run and absent in the other test run, the dielectric strength of the film of the former test run was improved over that of the film of the latter test run. FIG. 2 shows the results of another typical thermal oxidation, in which the insulation film had a thickness, $t_{ox}$, of 250 Å. In this graph, the curve 1 represents the change in average dielectric strength and the curve 2 the change in deviation. The graph shows that the average dielectric strength was 10 V in the test run using $CF_4$, whereas it was 4 V in the test run using no $CF_4$. This fact indicates that the incorporation of $CF_4$ brought about the improvement in the average dielectric strength. Although the absolute values of dielectric strength in this example are low, precisely the same effect can also be obtained at higher values. In these test runs, the dielectric strength was determined by using a voltage such that the electric current which flowed to the insulation film was on the order of $10^{-15}$ A/cm$^{-2}$. The graph also shows that the effect manifested in the improvement of the dielectric strength decreased when the volume ratio (%) of $CF_4$ to the oxidative gas exceeded 6%. The insulation film of $SiO_2$ is obtained more often than not in a state having positive electric charge entrapped therein at normal room temperature. Consequently, in the semiconductor surface of the conductive electrode-$SiO_2$ insulation film-semiconductor (COS) construction, more electrons are induced than in the thermally balanced state in most cases. The density of surface excess electrons, $N_{FB}$, is directly proportional to the positive electric charge present on the semiconductor surface side of the insulation film and, therefore, is desired to be as low as possible. It is also important that the variation with the bias voltage and temperature stress applied to the COS construction should be low. By the test, it has been established that the incorporation of the carbon fluoride gas lowers the value of $N_{FB}$ and the variation of $N_{FB}$ relative to the bias voltage and the temperature stress. FIG. 3 shows the results of the thermal oxidation conducted on a (100) plane Si ($t_{ox} \simeq 250$ Å) in an oxidizing atmosphere containing $CF_4$ (using oxygen as the oxidizing gas) at a temperature of 1000° C. In the graph, the curve 3 represents the change in the value of $N_{FB}$ and the curve 4 the increment in the value of $N_{FB}$ ($\Delta N_{FB}$) relative to a bias voltage of $\pm 2.5$ V and a temperature stress of 200° C. It is seen from the graph that $N_{FB}$ assumed a negative value when the amount of $CF_4$ incorporated was small. This means that in this case, the sign of $N_{FB}$ is reversed from that of the conventional $SiO_2$ film. This particular nature proves to be advantageous for designing the gate threshold voltage of the n-channel MOS transistor. It is also seen that when the amount of $CF_4$ incorporated accounts for about 1%, the variation in $N_{FB}$ ($\Delta N_{FB}$) relative to the bias voltage and the temperature stress is also small.

Figure 4:
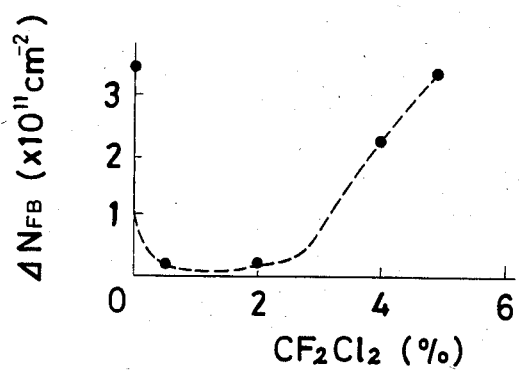
FIG. 4 is a graph showing a typical effect of the incorporation of carbon fluoride containing chlorine upon the decrease of $\Delta N_{FB}$.

When $SiO_2$ was grown on the (111) plane Si, despite the generally accepted theory that the value of $\Delta N_{FB}$ can not be lowered below the order of $10^{11}$ cm$^{-2}$ even by the incorporation of chlorine, the value could be lowered below $10^{10}$ cm$^{-2}$ by using any of the gaseous compounds of $CH_xF_yCl_z$ (wherein, $x+y+z=4$, $x=0$ to 3, $y=1$ to 4, $z=0$ to 3) such as $CHF_2Cl$, $CF_2Cl_2$ and $CF_3Cl$. FIG. 4 shows the value of $\Delta N_{FB}$ when the (111) plane Si with an insulating film having a thickness, $t_{ox}$, of 800 Å was used to obtain a COS construction by converting silicon surface to $SiO_2$ at a temperature of 1000° C. in an oxidizing atmosphere containing $CF_2Cl_2$ and oxygen as the oxidizing gas and subjecting the resultant to BT treatment at a temperature of 200° C. and a bias voltage of $\pm 5$ V. It is seen from this graph that the value of $\Delta N_{FB}$ was lower when the proportion of $CF_2Cl_2$ gas was up to 5% of oxidizing gas than when no $CF_2Cl_2$ gas was incorporated and that the value was decreased by one order of magnitude when the proportion was from 0.1 to 3%. These results may be ascribable to the synergistic effect of chlorine and fluorine. Heretofore, the MOS IC's have been produced chiefly on the (100) plane with a view to minimizing the value of $N_{FB}$ and maximizing the stability. By use of the technique of this invention, even the (111) plane MOS IC's can be obtained in a stable form. It was observed that the interface state density could be decreased also in the (111) plane by the incorporation of a carbon fluoride gas containing chlorine. Further by the method of this invention, the type of $SiO_2$ which exhibits the VI characteristic suggestive of a decrease in the trap concentration in the $SiO_2$ could be obtained. When the formed $SiO_2$ film was subjected to a thermal treatment in the atmosphere of an oxidative gas incorporating therein a carbon fluoride gas, the treatment was found to be effective in lowering the interface state density, the trap concentration, the value of $N_{FB}$ and that of $\Delta N_{FB}$.

Also, the same effect can be obtained when an $SiO_2$-based film is formed by supplying $SiH_4$, $SiCl_4$ and other silicon compounds onto a heated substrate in the same type of atmosphere.

As described specifically above with reference to working examples, the present invention facilitates the incorporation of fluorine into the $SiO_2$-based insulation film which has heretofore been found difficult to accomplish and promises various outstanding effects and contributes much to the semiconductor electronic industry.

What is claimed is:

1. A thermal oxidation method for the manufacture of an insulating film and an interface between the insulation film and a semiconductor insulation film, which comprises:

heating a silicon substrate or a silicon dioxide based film having an interface state density to a temperature of about 800° C. to about 1200° C. in an atmosphere formed by incorporating a chlorine-containing carbon fluoride gas into an oxidizing gas in an amount of up to 6% by volume based on the combined volume of the chlorine containing carbon fluoride gas and the oxidizing gas, said treatment resulting in improved electrical properties of the semiconductor and of the interface between said insulation film and said semiconductor.

2. The method according to claim 1, wherein said chlorine-containing carbon fluoride gas is of the formula:

$CH_xF_yCl_z$, wherein $x+y+z=4$, $x=0$ to 2, $y=1$ to 3 and $z=1$ to 3.

3. The method according to claim 1, wherein said chlorine-containing carbon fluoride gas is a compound selected from the group consisting of $CHF_2Cl$, $CF_2Cl_2$ and $CF_3Cl$.

* * * * *